United States Patent [19]

Amano et al.

[11] Patent Number: 5,005,184
[45] Date of Patent: Apr. 2, 1991

[54] METHOD AND APPARATUS FOR WAVEFORM EQUALIZATION

[75] Inventors: Tetsuya Amano, Hachioji; Seiichi Mita, Kanagawa; Morishi Izumita, Inagi; Nobukazu Doi, Hachioji; Mamoru Kaneko, Hokkaido; Hiroto Yamauchi, Katsuta; Susumu Kasai, Sagamihara, all of Japan

[73] Assignees: Hitachi, Ltd.; Hitachi Denshi Kabushiki Kaisha, both of Tokyo; Hitachi Video Engineering, Inc., Kanagawa, all of Japan

[21] Appl. No.: 240,196

[22] Filed: Sep. 6, 1988

[30] Foreign Application Priority Data

Sep. 8, 1987 [JP] Japan ................. 62-223026

[51] Int. Cl.$^5$ .................. H03H 7/30; H03H 7/40
[52] U.S. Cl. ..................... 375/14; 375/101; 333/18
[58] Field of Search ............. 375/11, 12, 18, 14, 375/101, 102, 103; 360/51; 333/18; 364/724.19, 724.20, 724.18, 724.14

[56] References Cited

U.S. PATENT DOCUMENTS

| | | | |
|---|---|---|---|
| 3,414,845 | 12/1968 | Lucky | 375/14 X |
| 3,508,153 | 4/1970 | Gerrish et al. | 375/18 X |
| 3,543,009 | 11/1970 | Voelcker, Jr. | 375/11 |
| 3,670,269 | 6/1972 | Starr et al. | 375/14 |
| 4,550,415 | 10/1985 | Debus, Jr. et al. | 364/724.2 X |
| 4,646,327 | 2/1987 | Kojima et al. | 375/60 |

*Primary Examiner*—Benedict V. Safourek
*Assistant Examiner*—Tesfaldet Bocure
*Attorney, Agent, or Firm*—Antonelli, Terry, Stout & Kraus

[57] ABSTRACT

A waveform equalization method whereby a transversal filter having 5 or more tapes is included, and a difference signal output, which is obtained when an isolated impulse response waveform of a digital modulated signal is inputted to the above described filter and the output of the filter is inputted to an adder, is allowed to have intersymbol interference at $\pm T/2$ with respect to the central axis time and has zero outputs at $\pm nT/2$ (where $n \geq 2$ and n is an integer).

4 Claims, 6 Drawing Sheets $$\begin{cases} Sd(t) = S(t-Td) \\ P(t) = a \cdot Sd(t \pm T') \\ So(t) = Sd(t) - P(t) \end{cases}$$

METHOD AND APPARATUS FOR WAVEFORM EQUALIZATION

BACKGROUND OF THE INVENTION

The present invention relates to a method and an apparatus for waveform equalization, and in particular to an equalization method and an equalization apparatus for transmitting digital signals or recording/ reproducing digital signals onto/from a recording medium.

When digital signals are to be recorded onto/ reproduced from a VTR or the like or are to be transmitted via a telephone line or the like, these medium have frequency cutoff characteristics. In some cases, therefore, digital codes crumble so as to cause interference between digital codes and it becomes difficult to discriminate between a logic "1" and a logic "0" of the digital signal.

When necessary digital signals are to be discriminated and reproduced from those waveforms, therefore, it is necessary to perform waveform compensation so that the discrimination may be performed without making an error.

By passing one waveform similar to a rectangular impulse having a time width T', for example, through the above described medium, a waveform as shown in FIG. 4B is obtained. Such a waveform is herein referred to as isolated impulse response waveform (hereafter simply abbreviated to impulse respons waveform). It is now assumed that the time width T'means a clock period of the MFM (Modified Frequency Modulation) scheme which is one of digital modulation schemes. And it is further assumed that the clock period T' is related to a bit period T of the digital data before modulation by relation T'=T/2 as described later. As means for applying the above described waveform compensation to the impulse response waveform as shown in FIG. 4B to obtain a so-called equalized waveform as shown in FIG. 4C, it is heretofore known to use a transversal filter comprising a delay circuit and an attenuator as shown in FIG. 4A (as described in "PCM Tsushin no Shinpo —"Progress in PCM Communication"written by Hiroshi Inose and Hiroshi Miyazawa and published by Sanpo, for example). In this equalization method, delay elements are connected in series. (Connection points between delay elements are referred to as taps. A transversal filter having three taps is illustrated in FIG. 4A.) In the above described equalization method, the weighted sum of outputs of respective taps of the serially connected delay elements (i.e., the sum of the product of respective outputs with attenuation coefficients) is used to eliminate intersymbol interference caused in the recording and reproducing system in principle.

The summary of the waveform equalization method using a transversal filter will now be described by referring to time charts of FIGS. 5A to 5C.

FIG. 5A shbws an ideal impulse response waveform having no intersymbol interference. This signal is denoted by i(t). If the high frequency response is deteriorated, the signal i(t) is typically changed to a signal S(t) as shown in FIG. 5B. "In FIG. 5B, a signal amplitude of S(t) at a time =T' is shown by S(T'). In other words, a signal which should originally become S(nT') =0 at t =nT'(where n is an integer, and n≠0) has an amount S(nT') of intersymbol interference. If noises are added to this signal, errors tend to be caused in that portion.

Such intersymbol interference is removed as follows. If the above described S(t) is inputted to the circuit of FIG. 4A, S(t) is typically delayed by Td in a delay circuit as far as a central tap. Accordingly, the output signal of the central tap is represented as ,ti Sd(t) =S(t−Td).

Signal sums corresponding to the amounts of intersymbol interference of Sd(t) at t =Td±T' are derived as sums of output signals from taps other than the central tap. These signal sums are subtracted from the signal obtained at the central tap to make output results at a t =Td±T' equal to zero. Amounts of intersymbol interference at these points are thus cancelled. As the output signals for producing these signal sums, an output signal obtained by passing the signal appearing at the input tap through an attenuator and an output signal obtained by passing the signal appearing at the input tap through delay circuits 11 and 12 respectively for delaying an input signal by T'successively and an attenuator 15 are used in FIG. 4A. The output signals of other taps are two signal waveforms as shown in FIG. 5D which differ in phase by T' with respect to the output signal Sd(t) of the central tap. The output signals of other taps are represented as ,ti p(t) =a·Sd t±T')

where a is an attenuation coefficient. The right side of the above described equation are elements of the above described weighted sum, and a represents a weighting coefficient.

If the output Sd(t) of the central tap as shown in FIG. 4A is supplied to a "+" terminal of an adder 16 and the outputs of other taps are respectively supplied to "−" terminals of the adder 16 to perform addition, the output So(t) of the adder 16 is given by $$Sd(t) = So(t) - p(t)$$

The above described a is so defined that So(t) provides null outputs at t =Td±T' as shown in FIG. 5E. In other words, the signal So(t) having no intersymbol interference as shown in FIG. 5E is obtained. The right side (Sd(t) −p(t)) of the equation shown above means the above described weighted sum.

The MFM signal which is one of the subjects of waveform equalization of the present invention is used in many apparatuses because the difference between the maximum and the minimum of the signal inversion interval is small and the magnetization inversion is not often performed. FIG. 6A shows an example of an NRZ signal before modulation. FIG. 6B shows an waveform diagram after MFM modulation. In the MFM modulation scheme, a logic "1" of the input signal is associated with inversion of polarity at a center of a bit period, and a logic "0" is associated with noninversion of polarity. If two logic "0" s are consequtive, however, the polarity is inverted on a boundary between bit periods.

As evident from the foregoing description, inversion intervals of the MFM signal become T, 1.5T and 2T. Accordingly, the clock frequency must be twice the frequency of the NRZ signal. In view of this clock timing, the inversion interval becomes 2T', 3T' and 4T' with respect to the clock period T', where T'=T/2. Assuming that intersymbol interference is caused on an MFM signal having an inversion interval of 2T', i.e., on an MFM signal comprising two consecutive bits of logic 1's, as an example, the waveform equalization method will now be described.

A signal having two consecutive bits of logic 1's has a rectangular waveform as shown in FIG. 7A. This is considered to be two consecutive rectangular waveforms, each of which corresponds to a single bit. When this signal is recorded and reproduced by a VTR or the like and its frequency characteristics are deteriorated, rectangular waveforms which are input signals become isolated waves having spread skirts, resulting in the lowered amplitude. In this case, however, two consecutive isolated waves overlap each other, resulting in a waveform as shown in FIG. 7B. That is to say, the amount f(T') of intersymbol interference overlaps with the peak of each isolated wave at T', resulting in a signal amplitude decreased by f(T').

When the conventional waveform equalization method is used, however, the reproduced signal as shown in FIG. 7B is restored to a correct signal having no intersymbol interference, resulting in a rather reduced signal amplitude as shown in FIG. 7C. When two waveforms shown by real lines in FIG. 7B are respectively equalized in accordance with the method show in FIGS. 5B -5E, two waveforms shown by real lines in FIG. 7C are obtained and as a result the amplitude doubled by these two waveforms is reduced from a value shown by a dotted line in FIG. 7B to a value shown by a dotted line in FIG. 7C. In other words, a digital modulated signal comprising a plurality of consecutive isolated waves, the signal amplitude is reduced by an amount corresponding to the removed intersymbol interference, resulting in raised probability of occurrence of code errors.

SUMMARY OF THE INVENTION

An object of the present invention is to provide a equalization method and an equalization apparatus which are free from the above described drawbacks of the conventional equalization method and equalization apparatus and which perform waveform compensation so that the equalized amplitude of a digital modulated signal comprising a plurality of consecutive isolated waves may become equal to or larger than the amplitude of the equalized signal obtained by conventional equalization.

In order to achieve the above described object, in accordance with the present invention, an isolated impulse response waveform of a digital modulated signal having a bit period T undergoes such waveform compensation that intersymbol interference is allowed at $\pm T/2$ with respect to the center axis time 15 of the equalized waveform and intersymbol interference is not caused at $\pm nT/2$ (where $n \geq 2$ and n is an integer).

Further as an apparatus implementing the above described waveform compensation, there is provided an apparatus in which a transversal filter having 5 or more taps is included, and a difference signal output, which is obtained when an isolated impulse response waveform of a digital modulated signal is inputted to the above described filter and the output of the filter is inputted to an adder, is allowed to have intersymbol interference at $\pm T/2$ with respect to the central axis time of the output waveform and has zero outputs at $\pm nT/2$ (where $n \geq 2$ and n is an integer).

The operation of the invention will now be described by referring to FIGS. 2A to 2D. The description will be made by taking an equalized waveform as shown in FIG. 2A as an example. Thick lines schematically shows a waveform reproduced by using waveform equalization of the prior art. The reproduced waveform assumes a logic "1" only at discrimination point 0 and assumes logic "0" s at remaining discrimination points $\pm nT'$.

On the other hand, a waveform $f_o(t)$ which has undergone equalization according to the present invention can be represented a $$f_o(\pm T') = \tfrac{1}{2} \cdot f_o(0)\, f_o(\pm nT') = 0$$

where $n \geq 2$ and n is an integer.

Accordingly, the reproduced waveform becomes the sum of the original signal represented by thick lines and interference represented by shaded regions. By referring to this equalized waveform, the relationship between the signal amplitude and the discrimination range for the cases where the inversion interval of the MFM signal is 2, 3 and 4 bits will now be described.

In case where the inversion interval of the MFM signal has a period of 2 bits as represented by "00110011" the equalized waveform of the prior art becomes as shown in FIG. 2B. On the other hand, an example whereto the present invention has been applied is shown in FIG. 2C. The signal represented by thick lines which should be originally "0" is overlapped by a signal represented by a shaded region, resulting in an increased signal amplitude. On the other hand, interference which is equal in amount to the increase of signal amplitude is generated at points where signals should originally be logic "0" is as well. The distance from a threshold which is an average level of these waveforms to the signal is indicated by an arrow. The discrimination range becomes equal to that of the prior art as shown in FIG. 2B. That is to say, the intersymbol interference $f_o(\pm T')$ does not affect the discrimination of the signal at all.

As a example in which the condition of the present invention is not satisfied, a case where intersymbol interference of the impulse response remains at not only $\pm T'$ but also $\pm 2T'$ is shown in FIG. 2D. In case of FIG. 2D, intersymbol interference close to $\tfrac{1}{4}$ level remains at $\pm 2T'$. The period of signal inversion interval is 2 bits in the same way as the above described case. In the present case, interference from only one direction overlaps with logic "1" portions of the signal, whereas interference from two directions overlaps with logic "0" portions. That is to say, an increase of interference at a point where the main signal should be originally a logic "0" becomes larger than the increase of the signal amplitude of the main signal which should be originally a logic "1". That is to say, the intersymbol interference of $f_o(\pm 2T')$ narrows the discrimination range.

For cases where the signal inversion interval has a period of 3 bits, an example in which the equalization scheme of the prior art is applied is shown in FIG. 3A, whereas a case where the condition of the present invention is satisfied is shown in FIG. 3B. As evident from comparison of FIG. 3A with FIG. 3B, the discrimination range does not change at discrimination points 0 and 2T' where only one of adjacent signals has the identical sign. At the discrimination point T' where both adjacent signals have identical signs, however, intersymbol interferences from two directions overlap each other by application of the present invention, resulting in increased signal amplitude. As compared with the prior art scheme, the discrimination range is expanded to twice in the present invention scheme.

In the same way, a prior art example in case of a 4-bit period is shown in FIG. 3C and an application example of the present invention is shown in FIG. 3D. As a result of application of the present invention, the signal amplitude is increased at discrimination points T' and 2T', the discrimination range being expanded to twice.

When the scheme of the present invention and an apparatus for implementing the scheme are applied to an MFM signal, therefore, interference at ±T' is left as shown in FIG. 3A to expand the discrimination range for signals comprising 3 bits and 4 bits and thereby reduce the error rate in MFM demodulation.

Further, it is a matter of course that the present invention can be applied to not only the MFM scheme but also other digital modulation schemes such as the $M^2$ modulation scheme.

DESCRIPTION OF THE PREFERRED EMBODIMENTS

Figure 1A:
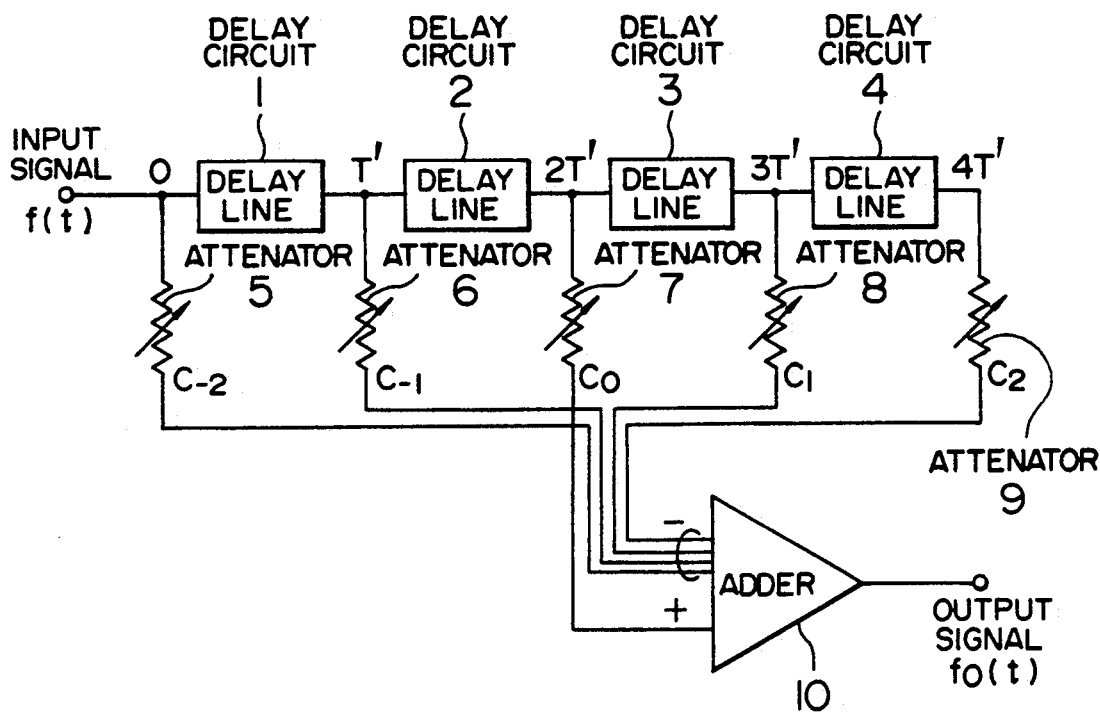
FIGS. 1A to 1C are a configuration diagram and waveform diagrams showing an embodiment of the present invention.
Figure 1B:
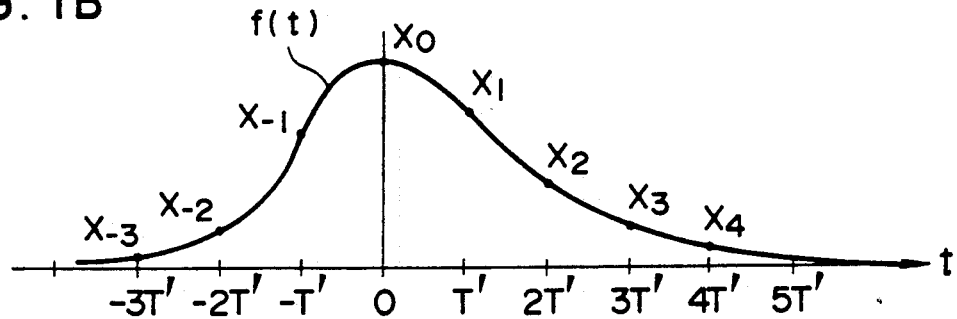
Figure 1C:
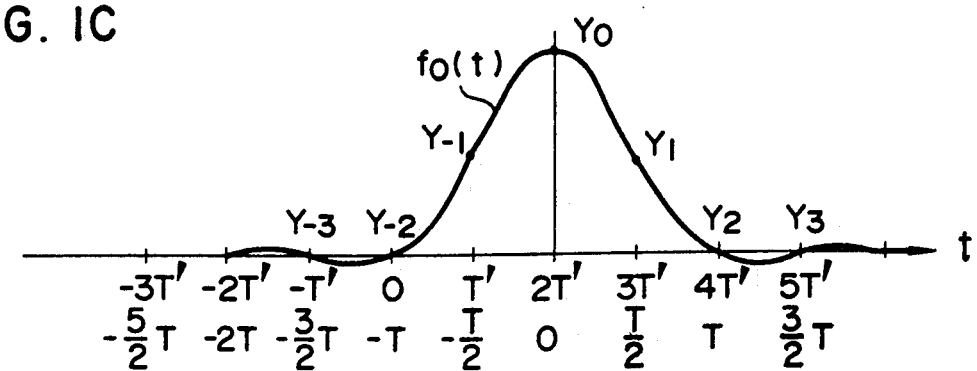
Figure 2A:
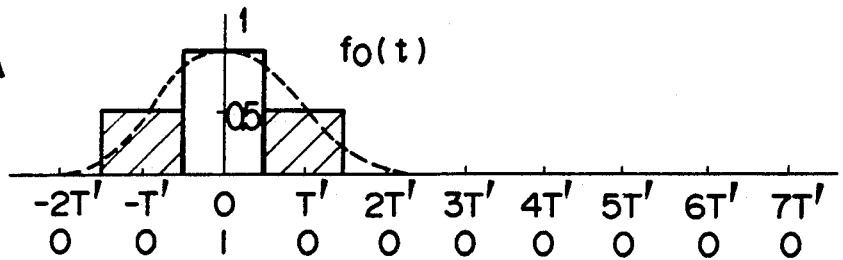
FIGS. 2A to 2D and 3A to 3D show waveforms obtained as a result of waveform equalization of the present invention.
Figure 2B:
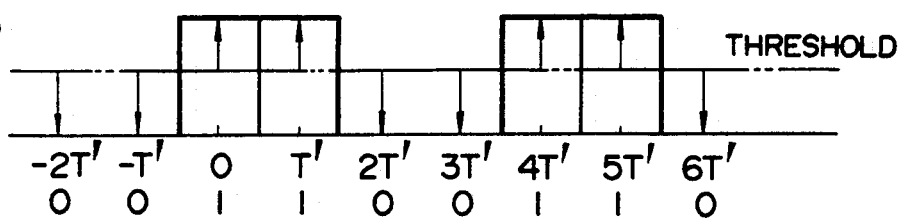
Figure 2C:
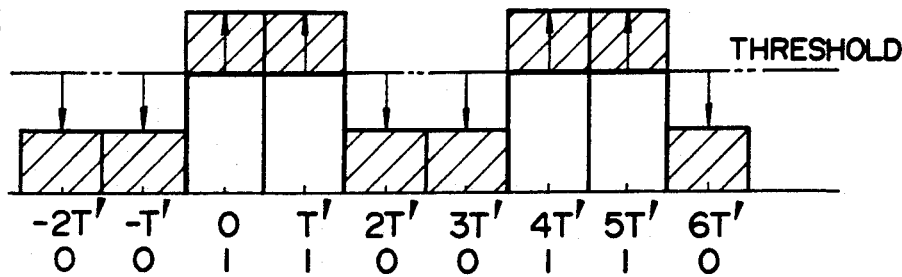
Figure 2D:
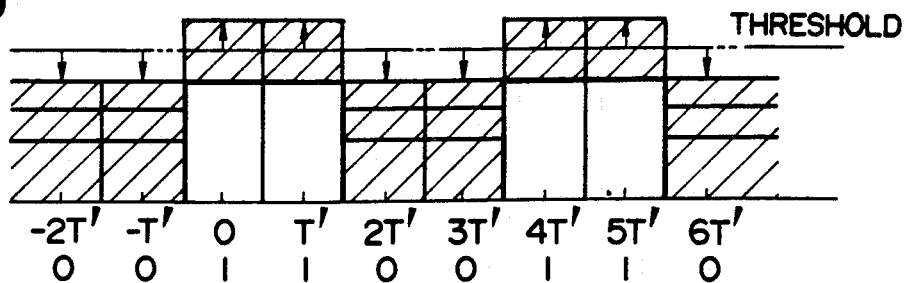
Figure 3A:
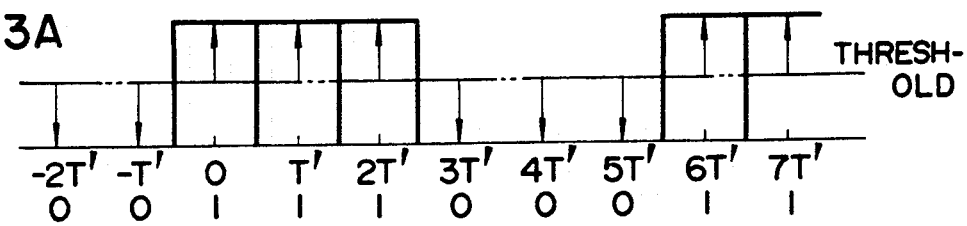
Figure 3B:
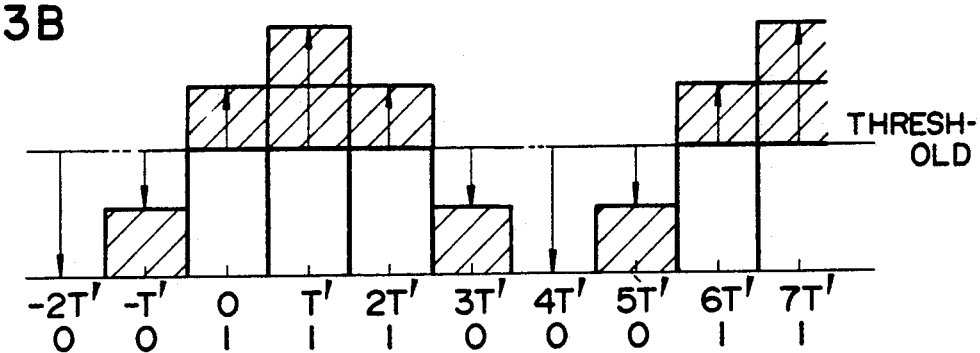
Figure 3C:
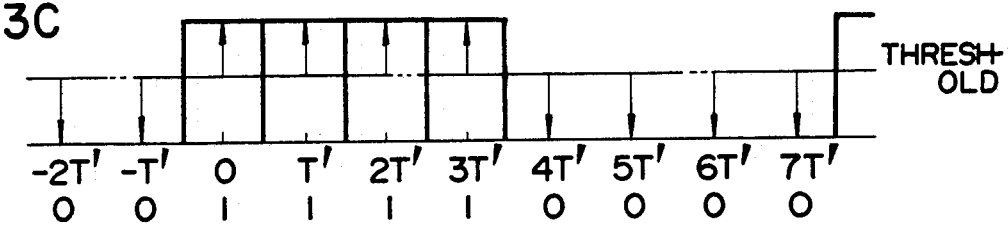
Figure 3D:
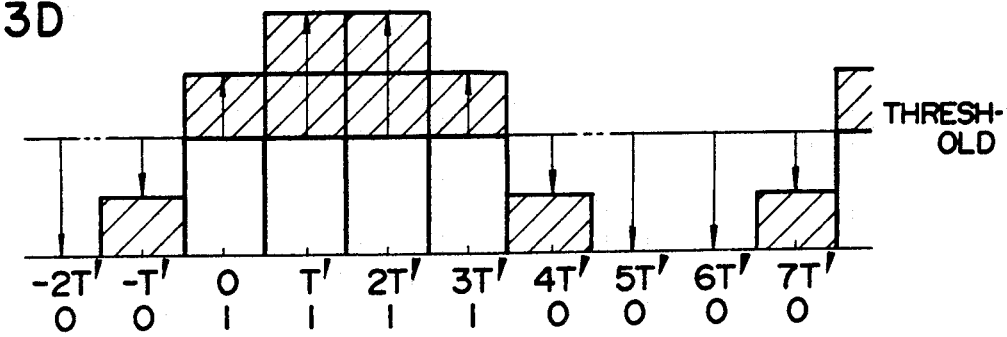
Figure 4A:
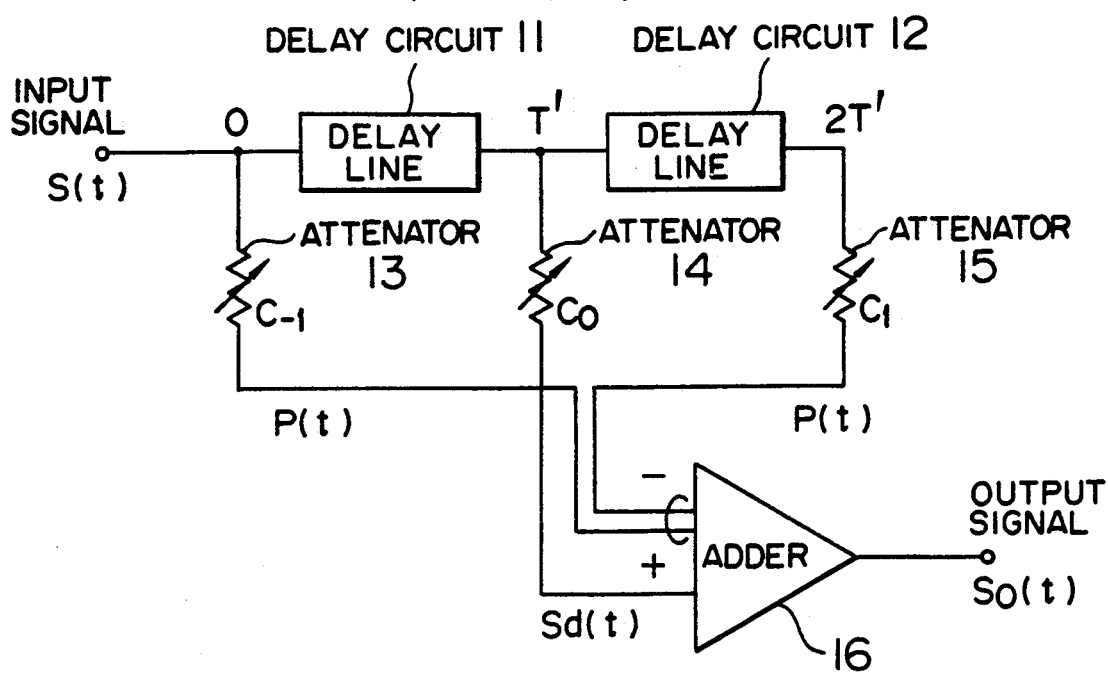
FIGS. 4A to 4C are a configuration diagram and waveform diagrams of waveform equalization of the prior art.
Figure 4B:
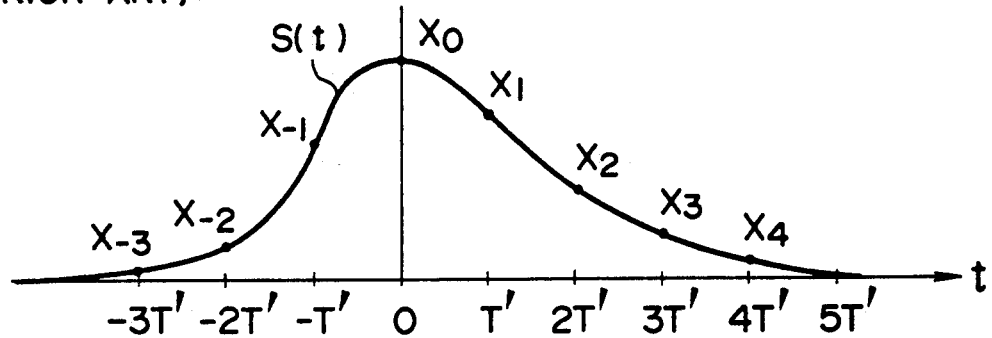
Figure 4C:
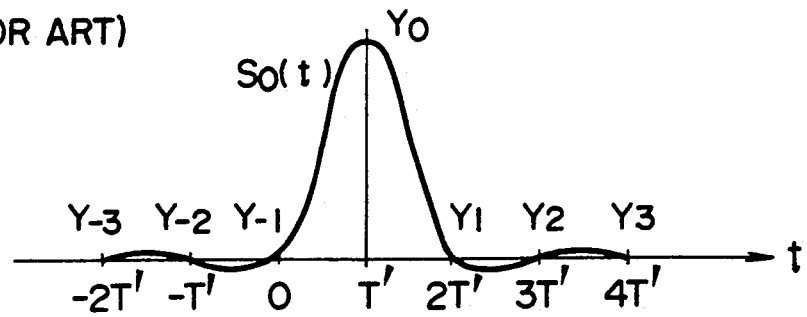
Figure 5A:
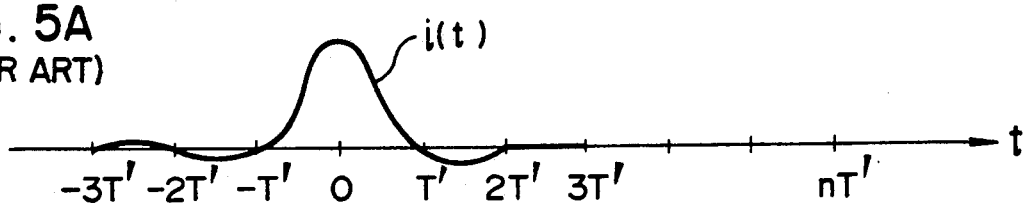
FIGS. 5A to 5E are waveform diagrams for explaining the principle of the waveform equalization of the prior art.
Figure 5B:
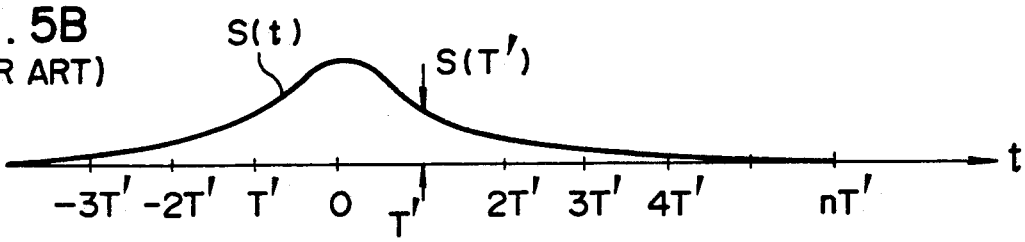
Figure 5C:
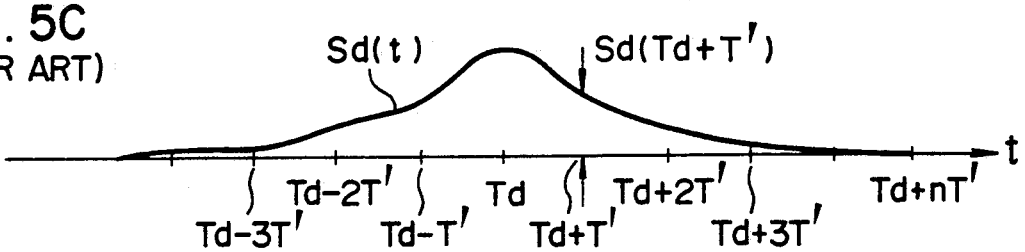
Figure 5D:
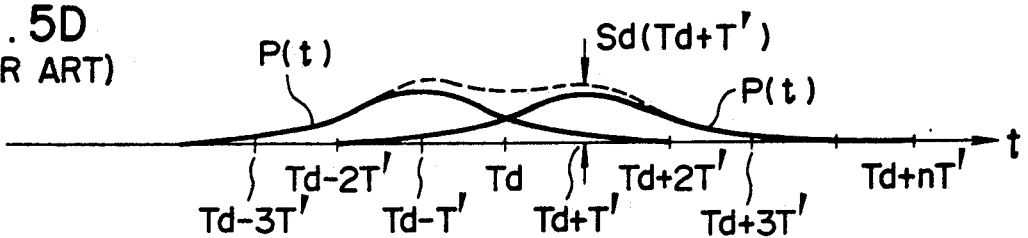
Figure 5E:
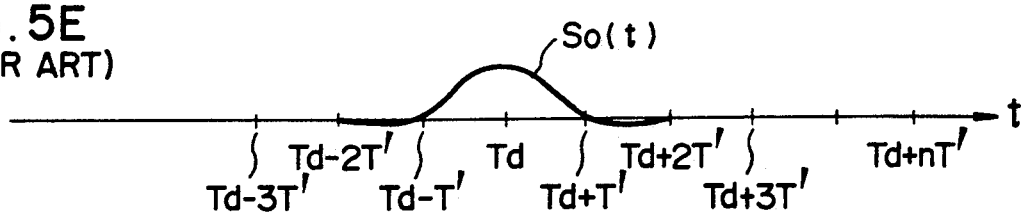
Figure 6A:
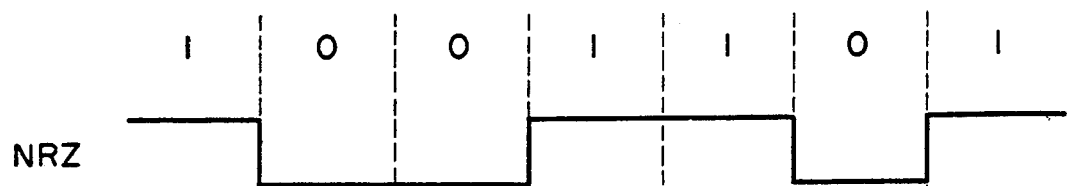
FIGS. 6A and 6B are waveform diagrams for explaining the MFM scheme.
Figure 6B:
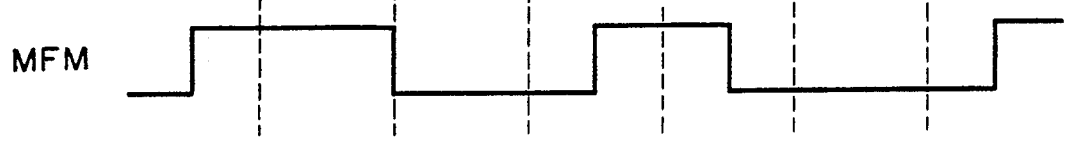
Figure 7A:
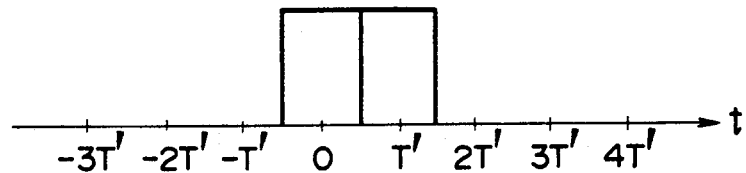
FIGS. 7A to 7C are waveform diagrams obtained as a result of waveform equalization of the prior art.
Figure 7B:
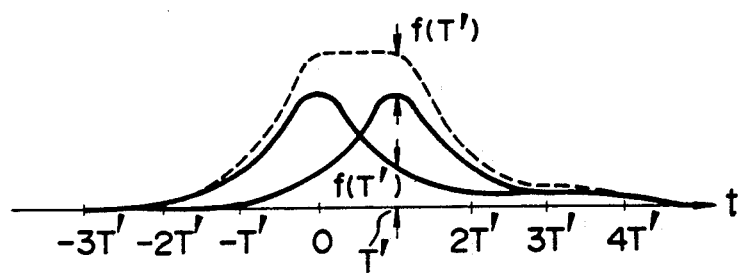
Figure 7C:
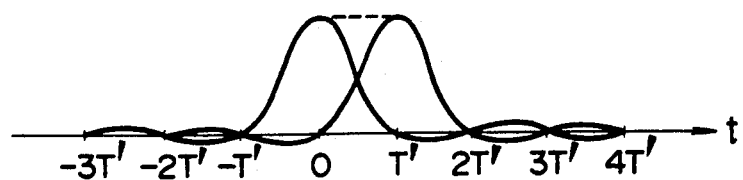

FIGS. 1A to 1E show an embodiment of the present invention. FIG. 1A shows an example of configuration of a transversal filter in a waveform equalization apparatus according to the present invention. FIG. 1B shows an isolated impulse response waveform for an MFM modulated signal, i.e., a waveform before equalization. By supplying the waveform of FIG. 1B to the apparatus of FIG. 1A, the equalized waveform shown in FIG. 1C is obtained.

In accordance with the present invention, the equalized waveform obtained by applying waveform compensation to an impulse response waveform has respective predetermined value outputs at points located at distances of ±T'(where T' is a clock period) with respect to the output obtained at the central point of the time axis and has zero outputs at points located at distances of ±2T'. That is to say, relative outputs at five points are regulated to obtain the waveform as shown in FIG. 1C. A transversal filter used as the equalization apparatus for this purpose is characterized in that the filter comprises 5 taps at the very least. FIG. 1A shows such a filter comprising 5 taps. As shown in FIG. 1A, a signal inputted to the transversal filter is successively delayed by time T'from the input point in delay circuits 1, 2, 3 and 4. The output of the central tap is used as the reference among 5 taps comprising connection points of delay circuits. Outputs of the central tap and four other taps are supplied to respective attenuators. The attenuators may be a variable resistor or with the like. Five kinds of signals outputted from those attenuators are supplied to an adder to produce a weighted sum output as described later. The equalized waveform as shown in FIG. 1C is thus obtained.

Accordingly, an equalization apparatus of the prior art in which outputs of points located at distances of ±T' from the central point of the time axis are made equal to zero can be realized by using a 3-tap transversal filter. On the contrary, however, featuring of the equalization waveform according to the present invention cannot be attained in this 3-tap apparatus.

Assuming that the data rate of the MFM signal is set at 50 Mbits/second, the delay circuits of the transversal filter will now be described.

The clock frequency of the MFM signal must be made twice the frequency of the NRZ signal which is 50 MHz. Therefore, the clock frequency of the MFM signal becomes 100 MHz. Accordingly, delay time values to be generated by the delay circuits become 0, 10, 20, 30 and 40 nsec. These delay circuits can be constituted by connecting delay lines of 10 nse in series and pulling out taps from connection points, for example.

Featuring of the equalization waveform of the present invention by using the attenuators of the transversal filter will now be described.

Assuming that the signal amplitude of the input signal f(t) at a discrimination point is $X_n$ (where n is an integer) as shown in FIG. 1B and the amount of attenuation of an attenuator located at each tap is $C_n$ (where n is an integer), the signal amplitude $Y_n$ (where n is an integer) of an output signal $f_o(t)$ at each discrimination point shown in FIG. 1C is represented by weighted sum as $$Y_{-2} = C_{-2} \cdot X_0$$
$$= C_{-1} \cdot X_{-1} + C_0 \cdot X_{-2} + C_1 \cdot X_{-3} + C_2 \cdot X_{-4}$$

$$Y_{-1} = C_{-2} \cdot X_1 + C_{-1} \cdot X_0$$
$$+ C_0 \cdot X_{-1} + C_1 \cdot X_{-2} + C_2 \cdot X_{-3}$$

$$Y_0 = C_{-2} \cdot X_2 + C_{-1} \cdot X_1 + C_0 \cdot X_0$$
$$+ C_1 \cdot X_{-1} + C_2 \cdot X_{-2} \text{ ps}$$
$$Y_1 = C_{-2} \cdot X_3 + C_{-1/2} = C_0 \cdot X_1$$
$$+ C_1 \cdot X_{-1} + C_2 \cdot X_{-2}$$

$$Y_2 = C_{-2} \cdot X_4 = C_{-1} \cdot X_3 + C_0 \cdot X_2 + C_1 \cdot X_1 + C_2 \cdot X_0$$

Since $C_0 \cdot X_n$ represents the main signal, the amount of attenuation $C_0$ is always unity. As indicated above, the attenuators may be variable resistors or the like which can be set to any attenuation value of $C_n$.

The meaning of the equations shown above will now be described. It is now assumed that the signal $Y_0$ shown in FIG. 1C is to be derived in response to $X_0$ of FIG. 1B. In FIG. 1A, other signals inputted to the adder together with the main signal $C_0X_0$ are signals obtained by passing waveform amplitude values $X_{-1}$ and $X_2$ (FIG. 1B) of points advanced with respect to $X_0$ respectively by T' and 2T' respectively through attenuators 8 and 9 respectively having attenuation values $C_1$ and $C_2$ and signals obtained by passing waveform amplitude values $X_1$ and $X_2$ (FIG. 1B) of points delayed with respect to the signal of $X_0$ respectively by T' and 2T' respectively through attenuators 6 and 5 respectively having attenuation values $C_{-1}$ and $C_{-2}$. By supplying these signals to "−" terminals of the adder 10 and the main signal to the "+" terminal of the adder, the signal $Y_0$ is obtained as the sum output. When $Y_1$ of FIG. 1C is to be derived in response to $X_1$ of FIG. 1B, signals obtained by passing waveform amplitude values $X_0$ and $X_{-1}$ of points advanced with respect to the main signal $X_0X_1$ respectively by T' and 2T' respectively through attenuators of $C_1$ and $C_2$ and signals obtained by passing waveform amplitude values $X_2$ and $X_3$ of points delayed with respect to $C_0X_1$ respectively by $T'$ and $2T'$ undergo addition together with the main signal $C_0X_1$ to yield $Y_1$.

From the equations shown above, attenuation values $C_{-2}$, $C_{-1}$, $C_0$, $C_1$ and $C_2$ are obtained so that $Y_0 = 1$, $Y_{-1} = 0 \sim 1$ (a predetermined value), $Y_1 = 0 \sim 1$ (a predetermined value), $Y_{-2} = Y_2 = 0$ or $Y_0 = 1$, $Y_{-1} = Y_1 = 0 \sim 1$ (predetermined values), $Y_{-2} = Y_2 = 0$.

As for the apparatus, outputs of the filter are inputted to the adder 10 and the attenuation values $C_n$ are adjusted to obtain the output signal $f_o(t)$ satisfying the above described conditions of $Y_n$ as the output.

If $Y_{-1}$ is equal to $Y_1$, the equalized waveform becomes symmetrical. In this case, a waveform especially causing less code errors is advantageously obtained.

In the present embodiment, a 5-tap transversal filter is used as the delay circuits. By increasing the number of taps, however, unnecessary intersymbol interference can further be reduced. As compared with the case of 5 taps.

In the present embodiment, the case of modulation of the MFM scheme has been described. However, it is a matter of course that the present invention can be applied to not only the MFM scheme but also other schemes such as the $M^2$ modulation scheme so long as the signal polarity is inverted within a bit period or on a boundary between bit periods in that modulation scheme.

If the above described modulated signal is recorded on a magnetic recording medium such as a magnetic disk or magnetic tape and the signal is reproduced by using a ring-shaped magnetic head, a differentiated signal is reproduced. In this case, the waveform equalization according to the present invention can be applied after the signal is passed through an integration circuit for integrating the signal to restore the original waveform.

In accordance with the present invention, all of the intersymbol interference is not removed but a part thereof is left in waveform equalization of an MFM signal. In case of a signal in which an identical signal lasts 1.5 or 2 times the bit period, therefore, the signal amplitude can be made larger. As a result, the discrimination range can be expanded and discrimination with less code errors can be realized.

This effect is obtained in not only the MFM modulation scheme but also other modulation schemes such as the $M^2$ modulation scheme so long as the signal polarity is inverted within a bit period or on a boundary between bit periods.

We claim:

1. A waveform equalization method for a digital modulated signal having an inverted polarity within a bit period lasting a time width of T or an inverted polarity on a boundary between bit periods, comprising the steps of:

inputting an isolated impulse response waveform of a digital modulated signal; and compensating said isolated impulse response waveform by permitting intersymbol interference at $\pm T/2$ with respect to the center axis of time of the waveform and eliminating intersymbol interference at $\pm nT/2$ which respect to the center axis of time of the waveform.

2. A waveform equalization method according to claim 1, further comprising the step of:

causing values of intersymbol interference at $\pm T/2$ to be equal to each other.

3. A waveform equalization apparatus for equalizing a digital modulated signal having an inverted polarity within a bit period lasting a time width of T or an inverted polarity on a boundary between bit periods, comprising:

output of said an input terminal for inputting a digital modulated signal;

at least four delay lines connected in series with said input terminal, wherein each delay line delays said digital modulated signal by a predetermined time;

at least five attenuators for attenuating said digital modulated signal, wherein each attenuator includes a first terminal and a second terminal, and wherein the first terminal of a first attenuator is connected to said input terminal, the first terminals of second third and fourth attenuators are corresponding connected between said delay lines and the first terminal of a fifth attenuator is connected to an output terminal of said series connected delay lines; and an adder connected to the second terminals of the attenuators, for adding attenuated signals; wherein said attenuators are set to predetermined values thereby causing an output of said adder to have intersymbol interference at $\pm T/$'with respect to the central axis of time of an output waveform and to have eliminated therefrom intersymbol interference at $\pm nT/2$ with respect to the central axis of time of said output waveform.

4. A waveform equalization apparatus according to claim 3, wherein values of intersymbol interference at $\pm T/2$ are made to be equal to each other.

* * * * *